DEFLECTION AMPLIFIER COMPENSATION LINEARIZER CIRCUIT

Filed March 20, 1961

INVENTOR.
John R. Kobbe

BY
Buckhorn, Cheatham & Blore
ATTORNEYS

United States Patent Office 3,185,887 Patented May 25, 1965

3,185,887
DEFLECTION AMPLIFIER COMPENSATION LINEARIZER CIRCUIT

John R. Kobbe, Beaverton, Oreg., assignor to Tektronix, Inc., Beaverton, Oreg., a corporation of Oregon
Filed Mar. 20, 1961, Ser. No. 96,803
10 Claims. (Cl. 315—26)

Figure 1:
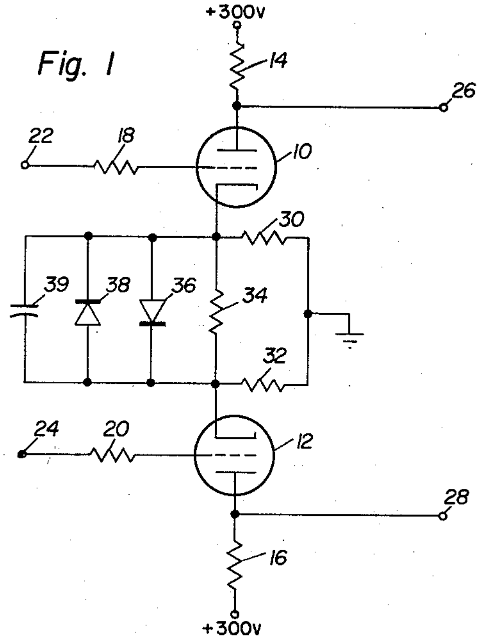

The present invention relates generally to electrical circuits and in particular to improved electrical amplifier circuits that are characterized by a substantially linear relationship between input and output voltages over a wide range of voltage amplitudes.

For the proper operation of many electrical circuits it is necessary that an accurate linear relationship between the input and output voltages be maintained. This is especially true of precision electrical amplifier circuits since it is essential that the wave shape of the output signal voltage of such an amplifier circuit duplicate that of the input signal voltage so that it is free from amplitude distortion and differs only in magnitude from that of the input voltage. Amplifier circuits previously available have not been entirely satisfactory because they do not have such a linear characteristic over a wide enough amplitude range to meet critical demands of electrical circuit applications requiring an extremely high gain in signal voltage. For example, one such demanding circuit is the output amplifier for the signal voltages applied to the vertical deflection plates of a cathode-ray tube used in a cathode-ray oscilloscope.

In order to overcome the disadvantages discussed above, the improved electrical amplifier circuit of the present invention uses a non-linear circuit element to compensate for the non-linear operating characteristics of conventional electrical amplifiers at high amplitudes of signal voltages. More specifically, it is desired to compensate for the non-linear operating characteristics of amplifiers utilizing degenerative feedback by means of a non-linear compensation element connected across the feedback impedance. The compensation element is of the type whose impedance varies with voltage in a manner so that it has a high impedance during the linear operation of the amplifier circuit and a low impedance during the non-linear operation of the amplifier circuit in order to decrease the degenerative feedback by decreasing the effective feedback impedance during the non-linear operation of such amplifier, without substantially affecting the degenerative feedback during linear operation of the amplifier.

In a representative embodiment of the present invention, a push-pull type amplifier using a common feedback resistor in parallel with a pair of series connected cathode bias resistors for negative current feedback may have its range of linear operation extended by placing a pair of front-to-back connected diode rectifiers across the feedback resistors. The impedance characteristics of these rectifiers are such that they lower the impedance of at least part of the feedback impedance when the voltage across them increases in magnitude as a result of input voltages of sufficient magnitude to cause non-linear operation of the push-pull amplifier. The result of this parallel connection is to decrease the effective feedback impedance so that the degenerative feedback is reduced and the output of the electronic amplifier valves used in the push-pull amplifier is correspondingly increased, thereby extending the range of linear operation of such amplifier.

Therefore, one object of the present invention is to provide an electrical circuit in which substantial linear relationship is maintained between its output and input voltages over a relatively wide range of voltage amplitudes.

Another object of the invention is to provide an electrical amplifier circuit in which there is compensation for the non-linear operating characteristics of such amplifier so as to extend its range of linear operation.

A further object of the present invention is to provide an electrical amplifier circuit in which the magnitude of the degenerative feedback signal used in such amplifier is varied in order to compensate for its non-linear amplifying characteristics and produce an extended range of linear operation.

Still another object of the present invention is to provide a push-pull type amplifier for use in a cathode-ray oscilloscope in which the amount of negative current feedback used in such amplifier is decreased by decreasing the effective feedback impedance in a manner which compensates for the non-linear amplifying characteristics of such amplifier and increases its range of linear operation.

Figure 2:
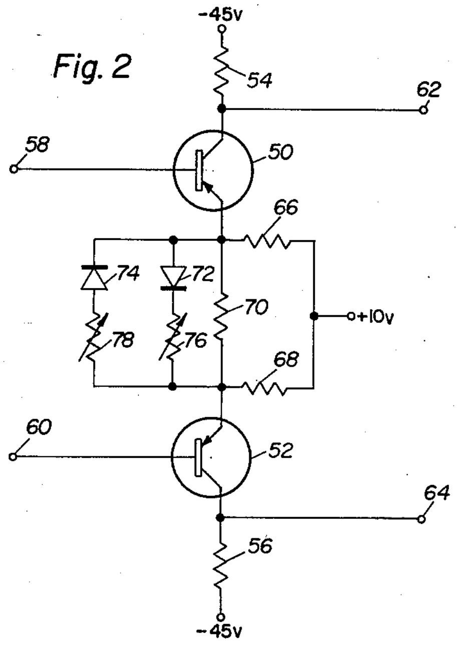
Figures 3, 4, 5:
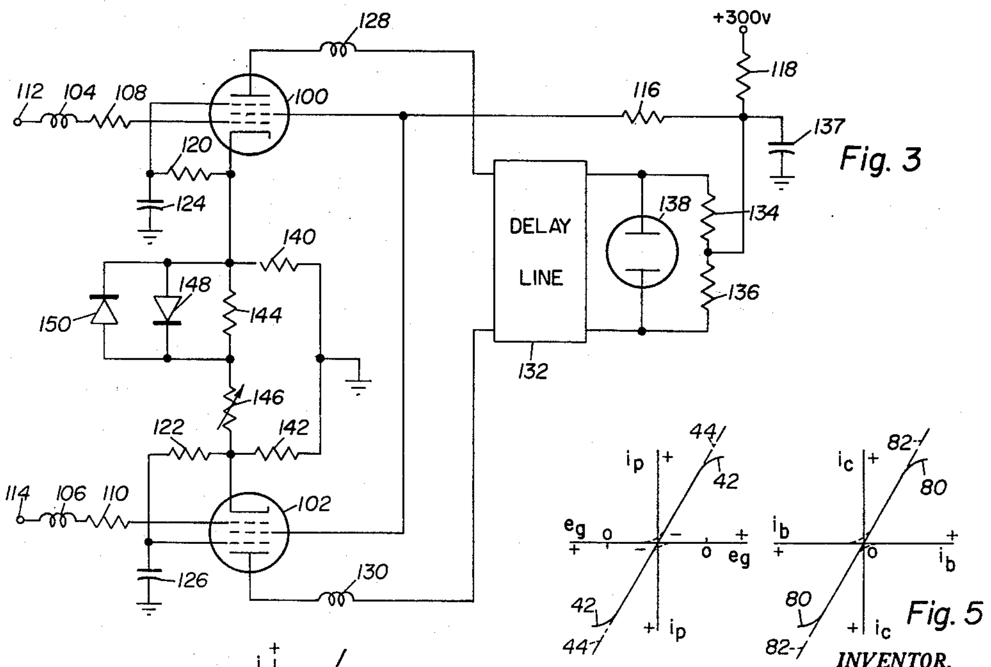
Figure 6:
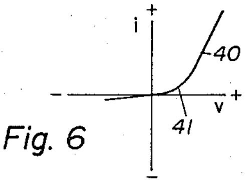

Other objects and advantages of the present invention will become apparent after referring to the following detailed description and the attached drawings of which:

FIG. 1 is a schematic diagram of one embodiment of the present invention directed to a push-pull type vacuum tube amplifier, FIG. 2 is a schematic diagram of another embodiment showing a push-pull type transistor amplifier, FIG. 3 is a schematic diagram of still another embodiment directed to a push-pull type amplifier used to supply the vertical deflection voltage in a cathode-ray oscilloscope, FIG. 4 is a graph comparing the operating characteristics of a conventional push-pull type vacuum tube amplifier and one made in accordance with the present invention, FIG. 5 is a graph similar to FIG. 4 but directed to push-pull type transistor amplifiers, and FIG. 6 is a graph showing operating characteristics of the type of rectifier used in the amplifier circuits of the present invention.

One embodiment of an amplifier made in accordance with the present invention is shown in FIG. 1. This push-pull type amplifier may include a pair of matched vacuum tubes 10 and 12 of the triode type having an anode, a cathode and a control grid. The anodes of each of these tubes are connected to a separate source of D.C. voltage through load resistors 14 and 16. The control grids of vacuum tubes 10 and 12 are each connected to a separate source of input voltage by input terminals 22 and 24 through coupling resistors 18 and 20 so that the two signal voltages applied to the control grids are 180° out of phase making the grid of tube 10 positive when the grid of tube 12 is negative and vice versa. The amplified output voltages are obtained across output terminals 26 and 28. Negative current feedback is utilized to stabilize the amplifier and eliminate distortion therein by means of the common cathode circuit consisting of cathode bias resistors 30 and 32 and common feedback resistor 34. The cathode bias resistors 30 and 32 are connected in series between the cathodes of vacuum tube 10 and vacuum tube 12 with their common lead connected to ground, and the common feedback resistor 34 is connected in parallel with these series connected cathode bias resistors. A pair of front-to-back connected compensation rectifiers 36 and 38 along with a high frequency compensation capacitor 39 are connected in parallel across the common feedback resistor 34. If the feedback voltage developed across feedback resistor 34 is of the proper polarity and increases in magnitude, one of the compensation rectifiers 36 and 38 will increase its current conductivity so that it decreases its impedance in a non-linear manner and substantially reduces the effective feedback impedance of the common cathode circuit with which it is connected in parallel.

The rectifiers 36 and 38 may be semiconductor diodes having operating characteristics similar to the characteristic curve 40 shown in FIG. 6. These diodes may be selected so that they decrease the degenerative feedback in the push-pull amplifier of FIG. 1 in a manner which compensates for the non-linear amplifying characteristics of such amplifier as shown by the plate current ($i_p$) vs. control grid voltage ($e_g$) curves of FIG. 4. The impedance of such a diode is proportional to the reciprocal of the slope of its characteristic curve so that it has relatively high impedance for low voltages below the knee 41 of the curve 40 and lower impedance above such knee. If the rectifier characteristic curve 40 is such that the voltages producing high forward impedance of such rectifier correspond to grid voltages resulting in the linear portion of the push-pull amplifier characteristic curve 42 in FIG. 4 and the rectifier voltages representing low forward impedance of the rectifier correspond to those grid voltages resulting in the non-linear portion of the characteristic curve 42, the resulting amplifying characteristic of the push-pull amplifier of FIG. 1 will follow the dashed line curve 44 which indicates an extended range of linear operation due to a decrease of degenerative feedback at grid voltages which formerly caused a non-linear amplifying characteristic.

FIG. 2 shows a push-pull type transistor amplifier similar to that of FIG. 1. This transistor amplifier may include a pair of matched transistors 50 and 52 which may be of the PNP type shown, or which may be of the NPN type not shown if the potentials shown are reversed. The collectors of these transistors 50 and 52 are each connected to a separate source of negative D.C. voltage through load resistors 54 and 56. Two separate sources of 180° phase shifted signal voltages are connected through input terminals 58 and 60 to the base electrodes of the transistors and the signal voltage output terminals 62 and 64 are connected between the collectors and the load resistors 54 and 56. Negative current feedback is provided by a common emitter circuit including two emitter bias resistors 66 and 68 and a common feedback resistor 70. The emitter bias resistors 66 and 68 are connected in series between the emitter electrodes of transistors 50 and 52 with their common lead connected to a source of positive D.C. voltage and the common feedback resistor 70 is connected in parallel with these bias resistors. A pair of front-to-back connected compensation rectifiers 72 and 74 are connected in parallel across the common feedback resistor 70 and may be provided with a pair of variable resistors 76 and 78 in series with such rectifiers. These variable resistors 76 and 78 vary the voltage applied across compensation rectifiers 72 and 74, respectively, and enable the use of rectifiers which need not be exactly matched with transistors 50 and 52. Conventional frequency compensation circuits may be used, but they have not been shown for the sake of clarity since they form no part of the present invention.

The operating characteristics of the push-pull transistor amplifier of FIG. 2 are shown by the curves of collector current ($i_c$) vs. base current ($i_b$) in FIG. 5. The composite characteristic curve of a push-pull transistor amplifier is shown by the solid line curve 80 for the conventional uncompensated amplifier and by dashed line curve 82 for the compensated amplifier of the present invention. Operation of the compensation rectifiers 72 and 74 in the transistor amplifier circuit of FIG. 2 is similar to the operation of the compensation rectifiers 36 and 38 in the vacuum tube amplifier circuit of FIG. 1 discussed above. As shown in FIG. 5, the resulting characteristic curve 82 of the compensated transistor amplifier indicates an extended range of linear operation over that of the previously uncompensated transistor amplifier curve 80.

Another embodiment of a push-pull type amplifier in accordance with the present invention which is used to supply the signal voltages to the vertical deflection plates in a cathode-ray oscilloscope is shown in FIG. 3. This amplifier circuit may include a pair of matched vacuum tubes 100 and 102 of the pentode type. The control grids of vacuum tubes 100 and 102 are each connected through a coupling impedance consisting of an inductor 104 and 106 respectively in series with a resistor 108 and 110 to separate sources of signal voltage having a 180° phase difference through input terminals 112 and 114. The screen grids of vacuum tubes 100 and 102 are connected together through series voltage dropping resistors 116 and 118 to a source of high positive D.C. voltage while the suppressor grids of vacuum tubes 100 and 102 are each connected to the cathodes of such tubes through grid biasing resistors 120 and 122 and to ground through A.C. bypass capacitors 124 and 126. Each anode of the vacuum tubes 100 and 102 is connected through an inductor 128 and 130 respectively to a load impedance in the form of a transmission delay line 132 which is terminated in its characteristic impedance to prevent reflections of signal voltages. This characteristic impedance termination may be in the form of two equal series connected resistors 134 and 136 which are connected at their common lead to a source of D.C. voltage through a dropping resistor 118 and to ground by A.C. bypass capacitor 137. Each of the vertical deflection plates in cathode-ray tube 138 of a cathode-ray oscilloscope are connected to opposite sides of the delay line 132 so that the amplified output signal voltages from vacuum tubes 100 and 102 are applied through the delay line 132 to the vertical deflection plates of the cathode-ray tube 138. The common cathode circuit of this push-pull amplifier is similar to that of the amplifier of FIG. 1, already discussed, in that it has a degenerative feedback impedance consisting of a pair of cathode bias resistors 140 and 142 connected in series between the cathodes of tubes 100 and 102 and a common feedback resistor 144 connected in series with a variable gain control resistor 146 across the pair of cathode bias resistors 140 and 142. Front-to-back connected compensation rectifiers 148 and 150 are connected in parallel with common feedback resistor 144 to decrease the degenerative feedback by decreasing the effective feedback impedance in the manner discussed above in regard to the amplifier of FIG. 1.

It should be noted that all of the amplifiers shown in FIGS. 1, 2 and 3 may be provided with variable resistors in series with the compensation diodes, such as variable resistors 76 and 78 in FIG. 2, in order to enable the use of rectifiers which are not perfectly matched with the electrical signal translating devices used. Also the term "electrical signal translating device" is hereby defined as any electronic element which may be used to amplify electrical signals including both a vacuum tube and a transistor. While the electrical amplifier circuits previously described have all been of the push-pull type, since such circuits readily enable the compensating rectifiers to be connected between points of equal potential under zero signal conditions, it is to be understood that the compensation means of the present invention can also be applied to a single ended type amplifier. For example in FIG. 1, the tube 12 can be eliminated along with its input and output connections and a source of positive potential having the same voltage as the zero signal voltage of the cathode of the tube 12 connected in place of the cathode of the tube 12. The rectifier 38 can then be also eliminated. It is to be understood therefore that the invention is not to be limited to the various embodiments illustrated in the preceding detailed description, but that its scope is to be determined only by the following claims.

I claim:

1. An electrical amplifier circuit having an extended range of linear operation comprising:

an electrical signal translating device having an emitting electrode, a collecting electrode and a control electrode, said emitting electrode being connected to the input terminal of said amplifier circuit and said collecting electrode being connected to the output terminal of said amplifier circuit, a feedback impedance connected to said emitting electrode to provide degenerative current feedback for said device, a non-linear element of variable impedance connected across said feedback impedance, and means to apply a feedback signal voltage across said element so that said element has a high forward impedance during the linear operation of said device and a low forward impedance during the non-linear operation of said device to vary the effective degenerative feedback impedance to compensate for the non-linear amplifying characteristics of said device.

2. An electrical amplifier circuit having an extended range of linear operation comprising:

an electron tube having a cathode, an anode and a control grid, and connected as a common cathode amplifier, a feedback resistor connected to said cathode for negative current feedback, a non-linear rectifier of variable forward impedance connected across said feedback resistor, and means to apply a feedback signal voltage across said rectifier so that it has a high forward impedance during the linear operation of said tube and a low forward impedance during the non-linear operation of said tube to vary the effective degenerative feedback impedance in order to compensate for the non-linear amplifying characteristics of said tube.

3. An electrical amplifier circuit having an extended range of linear operation comprising:

a transistor having an emitter, a collector and a base electrode, and connected as a common emitter amplifier, a feedback resistor connected to said emitter for negative current feedback, a non-linear rectifier of variable forward impedance connected across said feedback resistor, and means to apply a feedback signal voltage across said rectifier so that it has a high forward impedance during the linear operation of said transistor and a low forward impedance during the non-linear operation of said transistor to vary the effective degenerative feedback impedance in order to compensate for the non-linear amplifying characteristics of said transistor.

4. An electrical amplifier circuit having an extended range of linear operation comprising:

a first signal translating device having an emitting electrode, a collecting electrode and a control electrode, and connected as a common emitter amplifier;

a second signal translating device similar to said first device, connected as a common emitter amplifier and having its emitting electrode connected to the emitting electrode of said first device, a feedback impedance connected between said emitting electrodes of said first device and said second device for degenerative current feedback, a plurality of inversely connected non-linear elements of variable impedance connected across said feedback impedance, and means to apply a feedback signal voltage across said elements so that they have a high impedance during the linear operation of said devices and a low impedance during the non-linear operation of said devices to vary the effective degenerative feedback impedance in order to compensate for the non-linear amplifying characteristics of said devices.

5. A push-pull amplifier circuit having an extended range of linear operation comprising:

a first signal translating device having an emitting electrode, a collecting electrode and a control electrode connected at its control electrode to a first input terminal and connected at its collecting electrode to a first ouput terminal, a second signal tarnslating device similar to said first device and having its emitting electrode connected to the emitting electrode of said first device connected at its control electrode of a second input terminal and connected at its collecting electrode to a second output terminal, a pair of emitter bias feedback impedances connected in series between said emitting electrodes of said first device and said second device, a plurality of inversely connected parallel rectifiers of variable forward impedance connected across said pair of bias impedances, and a common feedback impedance connected to each of the emitting electrodes of the signal translating devices in parallel with said rectifiers to provide degenerative current feedback, and means for applying a feedback signal across said rectifiers so that they have a high impedance during the linear operation of said devices and a low impedance during the non-linear operation of said devices to vary the effective degenerative feedback impedance in order ot compensate for the non-linear amplifying characteristics of said devices.

6. A push-pull type amplifier circuit having an extended range of linear operation comprising:

a first electron tube having an anode, a cathode and a control grid, and connected as a common cathode amplifier, a second electron tube similar to said first tube, connected as a common cathode amplifier and having its cathode connected to the cathode of said first tube, a pair of cathode bias feedback resistors connected in series between the cathodes of said first tube and said second tube, a pair of parallel front-to-back connected semiconductor diodes connected across said pair of bias resistors, and a common feedback resistor connected in parallel with said diodes to provide degenerative current feedback for both of the tubes, and means for applying a feedback signal across said diodes so that they have a high impedance during linear operation of said tubes and a low impedance during non-linear operation of said tubes to vary the negative feedback by changing the effective impedance of the common cathode circuit in order to compensate for the non-linear amplifying characteristics of said tubes.

7. A push-pull type amplifier circuit having an extended range of linear operation comprising:

a first transistor having a collector, an emitter and a base electrode, and connected as a common emitter amplifier, a second transistor similar to said first transistor, connected as a common emitter amplifier and having its emitter connected to the emitter of said first transistor, a pair of emitter bias feedback resistors connected in series between the emitters of said first transistor and said second transistor, a pair of parallel front-to-back connected semiconductor diodes connected across said pair of bias resistors, and a common feedback resistor connected in parallel with said diodes to provide degenerative current feedback for both of the transistors, and means for applying a feedback signal across said diodes so that they have a high impedance during linear operation of said transistors and a low impedance during non-linear operation of said transistors to vary the degenerative feedback by changing the effective impedance of the common emitter circuit in order to compensate for the non-linear amplifying characteristics of said transistors.

8. A push-pull type amplifier circuit having an extended range of linear operation comprising:

a first transistor having a collector, an emitter and a base electrode, and connected as a common emitter amplifier, a second transistor similar to said first transistor, connected as a common emitter amplifier and having its emitter connected to the emitter of said first transistor, a pair of emitter bias feedback resistors connected in series between the emitters of said first transistor and said second transistor, a common feedback resistor connected across said pair of bias resistors, to provide degenerative current feedback for both of the transistors, a pair of front-to-back connected semiconductor diodes connected across said common feedback resistor to vary the effective degenerative feedback impedance so that it is low during the non-linear operation of said transistors in order to compensate for the non-linear amplifying characteristics of said transistors, and a pair of variable resistors connected so that each is in series with one of said diodes to control the operation of said diodes.

9. A push-pull type amplifier circuit having an extended range of linear operation comprising:

a first vacuum tube having an anode, a cathode and a control grid, and connected as a common cathode amplifier, a second vacuum tube similar to said first tube, connected as a common cathode amplifier, and having its cathode connected to the cathode of said first tube, a pair of cathode bias feedback resistors connected between the cathodes of said first tube and said second tube, a common feedback resistor connected across said pair of bias resistors to provide degenerative current feedback for both of the tubes, a variable gain control resistor connected in series with said common feedback resistor so that this series connection is in parallel with said pair of bias resistors, and a pair of front-to-back connected semiconductor diodes connected across said common feedback resistor to vary the effective degenerative feedback impedance so that it is low during the non-linear operation of said tubes in order to compensate for the non-linear amplifying characteristics of said tubes.

10. A push-pull type amplifier circuit having an extended range of linear operation for supplying the vertical deflection voltages in a cathode-ray oscilloscope comprising:

a first electron tube having an anode, a cathode and a control grid, and connected as a common cathode amplifier, a second electron tube similar to said first tube, connected as a common cathode amplifier and having its cathode connected to the cathode of said first tube, a delay line terminated in its characteristic impedance connected to the anodes of said first tube and said second tube as the load impedance for said amplifier and connected across the vertical deflection plates of said cathode-ray oscilloscope to supply vertical deflection signal voltages, a pair of cathode bias feedback resistors connected between the cathodes of said first tube and said second tube, a common feedback resistor connected across said pair of bias resistors to provide degenerative current feedback for both tubes, and a pair of front-to-back connected diodes connected across said common feedback resistor to vary the effective degenerative feedback impedance so that it reduces the feedback during the non-linear operation of said tubes in order to compensate for the non-linear amplifying characteristics of said tubes.

References Cited by the Examiner

UNITED STATES PATENTS

| | | | |
|---|---|---|---|
| 2,412,210 | 12/46 | Edson et al. | 315—28 |
| 2,444,864 | 6/48 | Ziel et al. | 330—87 |
| 2,476,900 | 7/49 | Olson | 330—87 |
| 2,501,857 | 3/50 | Stewart | 315—26 |
| 2,680,160 | 6/54 | Yaeger | 330—15 |
| 2,768,324 | 10/56 | Jarema et al. | 315—26 |
| 2,931,986 | 4/60 | Ensink et al. | 330—15 |

FOREIGN PATENTS

| | | |
|---|---|---|
| 933,764 | 10/55 | Germany. |

DAVID G. REDINBAUGH, *Primary Examiner.*

BENNETT G. MILLER, ROBERT SEGAL, *Examiners.*